United States Patent [19]

Jo

[11] Patent Number: 5,610,090
[45] Date of Patent: Mar. 11, 1997

[54] METHOD OF MAKING A FET HAVING A RECESSED GATE STRUCTURE

[75] Inventor: Jun W. Jo, Seoul, Rep. of Korea

[73] Assignee: Goldstar Co., Ltd., Seoul, Rep. of Korea

[21] Appl. No.: 589,569

[22] Filed: Jan. 22, 1996

Related U.S. Application Data

[63] Continuation of Ser. No. 232,953, Apr. 25, 1994, abandoned.

[30] Foreign Application Priority Data

Apr. 27, 1993 [KR] Rep. of Korea ............... 7083/1993

[51] Int. Cl.⁶ .................. H01L 21/265; H01L 21/20; H01L 21/44; H01L 21/48
[52] U.S. Cl. ............... 437/39; 437/126; 437/203; 437/912; 437/944
[58] Field of Search ............... 437/126, 39, 203, 437/912, 944

[56] References Cited

U.S. PATENT DOCUMENTS

| | | | |
|---|---|---|---|
| 3,813,585 | 5/1974 | Tarui et al. | 257/284 |
| 3,898,353 | 8/1975 | Napoli et al. | 257/284 |
| 3,920,861 | 11/1975 | Dean | 437/203 |
| 4,393,557 | 7/1983 | Pao et al. | 257/284 |
| 4,517,730 | 5/1985 | Meignant | 257/280 |
| 4,525,919 | 7/1985 | Fabian | 437/944 |
| 4,578,343 | 3/1986 | Kosemura et al. | 430/296 |
| 4,616,400 | 10/1986 | Macksey et al. | 437/912 |
| 4,895,810 | 1/1990 | Meyer et al. | |
| 4,927,782 | 5/1990 | Davey et al. | |
| 4,970,386 | 11/1990 | Buck | |
| 5,019,522 | 5/1991 | Meyer et al. | |
| 5,045,903 | 9/1991 | Meyer et al. | |
| 5,112,763 | 5/1992 | Taylor et al. | 437/41 |
| 5,120,668 | 6/1992 | Hsu et al. | |
| 5,181,087 | 1/1993 | Usagawa et al. | |
| 5,266,146 | 11/1993 | Ohno et al. | 156/345 |
| 5,338,703 | 8/1994 | Matsuoka | 437/912 |

FOREIGN PATENT DOCUMENTS

| | | | |
|---|---|---|---|
| 63-15475 | 1/1988 | Japan. | |
| 3-120729A | 5/1991 | Japan | 437/912 |
| 6-45363 | 2/1994 | Japan | 437/912 |

*Primary Examiner*—Mary Wilczewski
*Assistant Examiner*—Brian K. Dutton
*Attorney, Agent, or Firm*—John P. White

[57] ABSTRACT

A Field Effect Transistor having a recessed gate comprises a substrate, a source electrode and a drain electrode, a recessed channel region formed over an area of the semiconductor substrate between the source electrode and the drain electrode, and a gate electrode inclined toward the source electrode and formed over the recessed channel portion.

11 Claims, 7 Drawing Sheets

METHOD OF MAKING A FET HAVING A RECESSED GATE STRUCTURE

This application is a continuation of U.S. Ser. No. 08/232,953, filed Apr. 25, 1994, now abandoned.

FIELD OF THE INVENTION

This invention relates to a Field Effect Transistor(FET) having a recessed gate structure and method of fabricating the same, and more particularly to the FET having a recessed gate of an asymmetrical structure and method of producing the same.

BACKGROUND OF THE INVENTION

The improved performance of a GaAs MESFET (Metal Semiconductor FET) can be achieved by the high cutoff frequency, the lower parasitic resistance and the reduced noise coefficient.

For these purposes, there have been employed the various methods such as the adoration of the short gate length, a recessed gate structure, an n+ source/drain contact area, or the buffer layer in the device.

Figure 1:
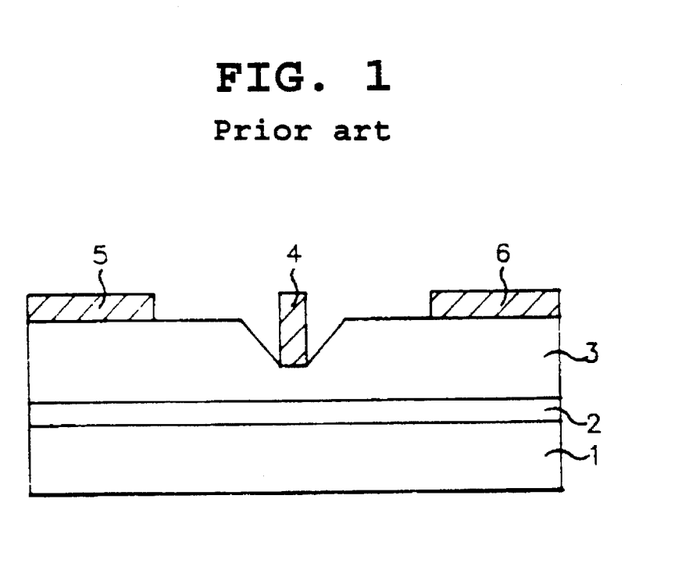
FIG. 1 is a sectional view of FET having a recessed gate structure according to the conventional art.

FIG. 1 shows a sectional view of GaAs MESFET having a recessed gate according to the conventional art.

The device includes an active area 3 formed over a GaAs substrate 1 through the interposed buffer layer 2 therebetween, a source electrode 5 and a drain electrode 6 which are spaced apart from each other, a recessed channel in the active area 3 and between the source electrode 5 and the drain electrode 6, and a gate electrode 4 on the recessed channel part.

Although the MESFET having the recessed gate can be fabricated through the simple procedures, the device has the drawbacks of the lower breakdown voltage between the source and the drain, making it improper to use as a power element, and the worse microwave performance due to the electric field accumulation between the gate electrode 4 and the drain electrode 6.

So as to solve the above drawbacks, M. M. Macksey, et al, has proposed the manufacturing method of the GaAs FET having the double recessed channel, which will be explained below, with reference to FIGS. 2A to 2G.

Figure 2A:
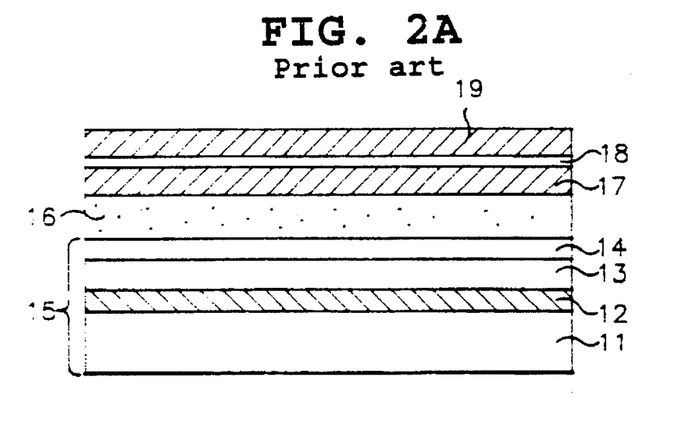
FIGS. 2A to 2G are sectional views showing the process steps of FET having a recessed gate structure according to the conventional art.

As shown in FIG. 2A, after a source pole and a drain pole are formed by depositing metal on a GaAs semiconductor layer 15 having stacks of a substrate 11, a buffer layer 12, an n type region 13 and an n+ type region 14, and on the stacks are sequentially deposited a photoresist film for leveling or a planarizing layer 16, a PMMA layer 17, a layer of Ge 18 and another PMMA layer or an imaging layer 19, leading to the multilayer structure.

Figure 2B:
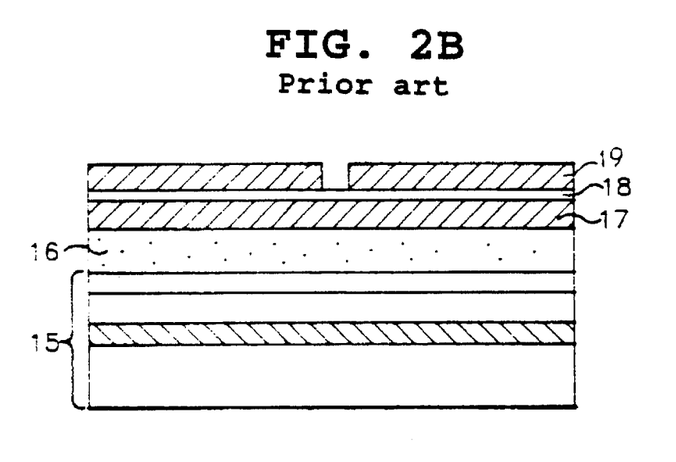

By use of the electron-beam lithography technique, the imaging layer 19 is patterned to form a gate electrode pattern as shown in FIG. 2B.

Figure 2C:
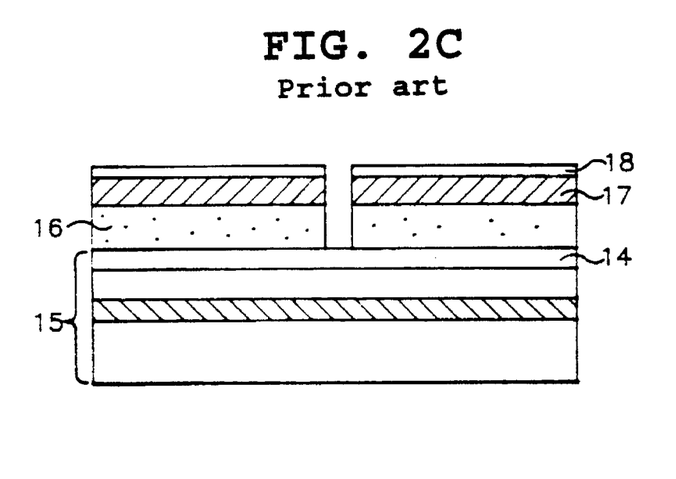

Next, referring to FIG. 2C, the imaging layer having the gate pattern therein acts as the etch mask during Reactive Ion Etch (RIE) process using $O_2$ for selectively etching a layer of Ge 18, the PMMA layer 17 and the planarizing layer 16, whereby the top layer of PMMA layer or imaging layer is vanished during RIE process using $O_2$ associated with the PMMA layer 17 and the planarizing layer 16.

Figure 2D:
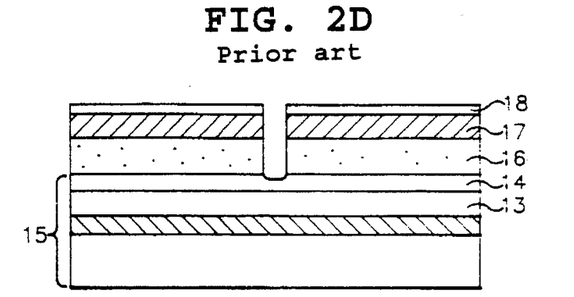

The etching of a layer of Ge 18, PMMA layer 17 and planarizing layer 16 allows the n+ type region 14 to partly expose and then the exposed area is further wet etched in a constant depth to form a first recess or gate recess, as shown in FIG. 2D.

Figure 2E:
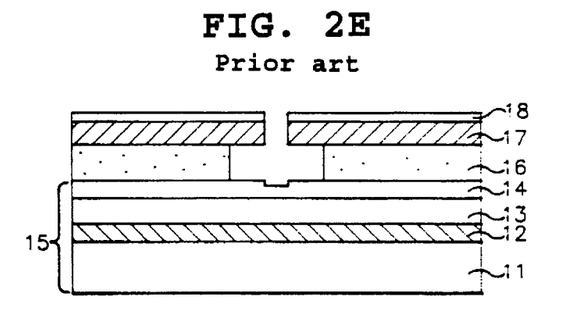

A layer of Ge 18 and the planarizing layer 16 underneath the PMMA layer 17 are then removed using the developer, thereby leaving partly under cut structure as shown in FIG. 2E.

Figure 2F:
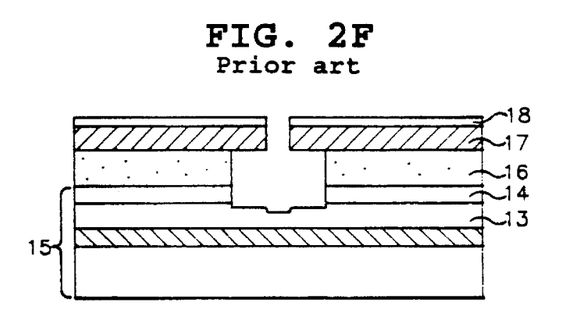
Figure 2G:
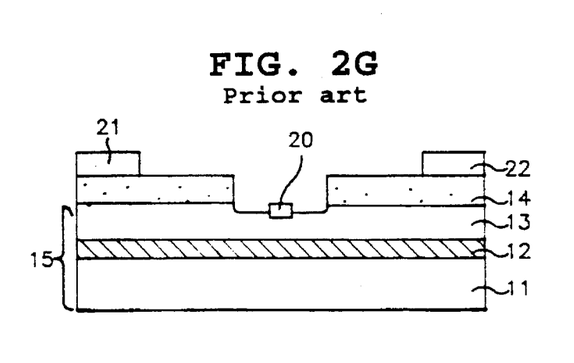

The n+ type region 14 and the n type region 13 are wet etched to form a second recess or a wide recess, which is shown in FIG. 2F. Next, as shown in FIG. 2G, after deposition of metal on the GaAs semiconductor layer 15, the layers of germanium 18, PMMA 17 and image 19 are totally removed using lift-off process, and a source electrode 21 and a drain electrode 22 are formed by depositing a metal on the wide recessed GaAs semiconductor layer 15. Thus, the fabrication of the FET is completed. The n+ type ledge channel structure by the conventional art makes the wide recess width narrower, so that the gate electrode 20 is positioned near the n+ type region 14. Thus, the transfer gain increases with the decrease in the parasitic resistance Rs between the source electrode and the gate electrode, but the gain is rather lower because of the increased feedback capacitance Cdg between the gate electrode and the drain electrode. Also, the gate breakdown voltage tends to be lower.

Meanwhile, the wider width of the wide recess causes to increase the parasitic resistance between the source electrode and the gate electrode, which results in the lower gain. Thus, it is necessary to defining the width of the wide recess so as to take the balanced values of the transfer gain and the breakdown voltage.

Another problem in the prior art is that there must be optimally formed the width of the wide recess and the width/depth of the gate recess at the etch processes in twice for forming the gate recess and the wide recess.

SUMMARY OF THE INVENTION

The object of this invention designed for solving foregoing problems, is to provide a method for reducing the output capacitance and the resistance between the gate and source as well as the feed-back capacitance and the field concentration between the gate and drain, and improving reduction of gain caused by inadequate control over the height of the channel due to the gate in an FET having ultra-short gate length(below 0.15µ m) by forming the gate recess structure to be asymmetrical in respect to the source electrode and the drain electrode.

According to the present invention, FET having a recessed gate structure comprises a substrate; a source electrode and a drain electrode which are spaced apart from each other; a recessed channel region formed over an area of the semiconductor substrate between the source electrode and the drain electrode; and a gate electrode which is inclined toward the source electrode and formed over the recessed channel portion.

According to another aspect of the present invention, the method of making a FET having a recessed gate structure comprises the steps of: forming a source electrode and a drain electrode over a semiconductor substrate; sequentially forming a planarizing layer, a feature transfer layer and an imaging layer over the whole surface of the semiconductor substrate having the source and drain electrode; selectively removing an area for a gate electrode formation by patterning the imaging layer; selectively etching the feature transfer layer, using the imaging layer as an etch mask; anisotropically etching the exposed planarizing layer by etching the feature transfer layer; overcutting the part of the planarizing layer in the vicinity of the drain electrode; forming a recessed region by etching the exposed surface portion of the semiconductor substrate resulting from the etch of the planarizing layer; depositing a metal layer so as to form a gate electrode throughout the whole surface of the substrate; and removing the deposited metal layer over an area except for the gate formation area of the recessed region.

DETAILED DESCRIPTION OF THE PREFERRED EMBODIMENTS

Figure 3:
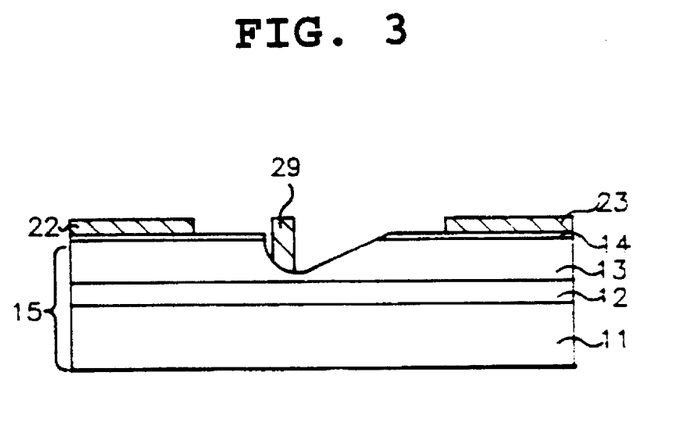
FIG. 3 is a sectional view of FET having a recessed gate structure according to the present invention.

FIG. 3 shows a sectional view of a FET having a recessed gate structure in accordance with the first embodiment of the invention.

Referring to FIG. 3, the FET having the recessed gate structure includes a source electrode 22 and a drain electrode 23 which are spaced apart from each other, a recessed channel region having a portion which is dug in deep depth in the vicinity of the source electrode and a gradually inclined surface area in the vicinity of the drain electrode, and located in the semiconductor layer 15 and between the source electrode 22 and the drain electrode 23 in an asymmetrical structure, and a gate electrode 29 near the source electrode and over the recessed channel region.

Such a device provides effects of decreasing the resistance between the gate electrode 29 and the source electrode 22 as well as the feed-back capacitance and the electric field concentration between the gate electrode 29 and the drain electrode 23.

This is due to the recessed gate structure that is asymmetrically positioned with respect to the source and drain electrodes.

FIGS. 4A to 4E are sectional views explaining the process steps of the FET having the recessed gate structure.

Figure 4A:
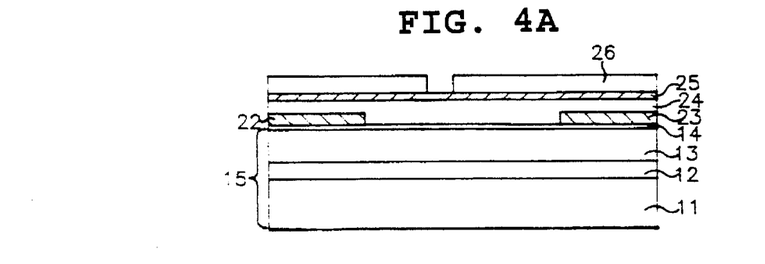
FIGS. 4A to 4E are sectional views showing the process steps of FET having a recessed gate structure in accordance with the first embodiment of the invention.

A semiconductor layer 15 is provided which comprises a buffer layer 12, a GaAs active layer 13 and an n+ type region 14 over a semi-insulating GaAs substrate 11. And the source and drain electrodes 22, 23 are formed patterning a deposited metal layer over the semiconductor layer 15 by the photolithographic technique.

Thereafter, on the whole surface of the resultant structure are sequentially deposited a planarizing layer 24, a feature transfer layer 25 and an imaging layer 26, thereby producing a multilayer structure.

The planarizing layer may be made of the photoresist material and the feature transfer layer is employed to transfer the features delineated in the imaging layer into the planarizing layer, wherein the feature transfer layer is made of such as PMMA or photoresist material and the planarizing layer made of, for example, SiN or $SiO_2$.

And the planarizing layer 24 has the thickness higher than 1 μm. Now, a gate electrode pattern is formed selectively removing the defined gate electrode area by applying the electron-beam lithography or the lithography utilizing the contact aligner into the imaging layer 26.

Figure 4B:
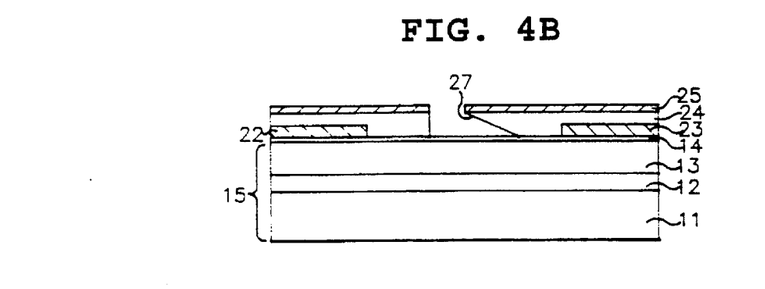

As shown in FIG. 4B, utilizing the imaging layer 26 as the etch mask in which the required gate pattern is delineated, the underlying feature transfer layer 25 undergoes the selective anisotropic etch such as RIE in the fluorinated gas such as $CF_4$, $CHF_3$ and etc, or Reactive Ion Beam Etching (RIBE). The etching of the feature transfer layer 25 allows it to partly expose the planarizing layer made of the photoresist material which is subjected to, for example, the anisotropic etch process in $O_2$ plasma according to the subsequent sequence. After said etch process, the substrate is inclined so that the source electrode 22 can be upwardly elevated. The ion beam milling method or RIE in $O_2$ and Ar plasma is then employed to overcut, which is denoted as reference numeral 27, the part of the planarizing layer 24 in the vicinity of the drain electrode 23. During the etch process of the planarizing layer 24, the imaging layer 26 is totally removed.

Figure 5:
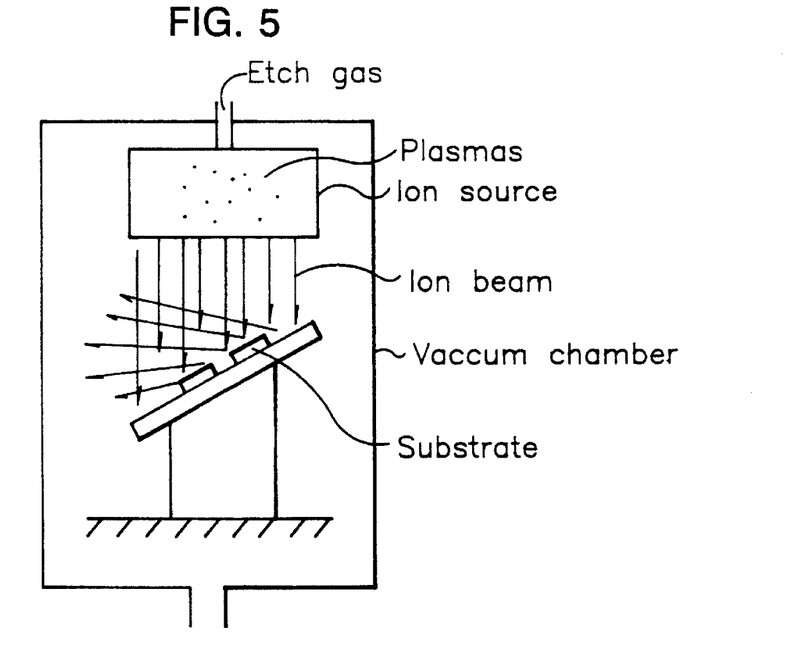
FIG. 5 schematically shows the equipment for making the FET having a recessed gate structure.

FIG. 5 schematically shows the equipment for overcutting the part of the planarizing layer in the vicinity of the drain electrode.

Figure 4C:
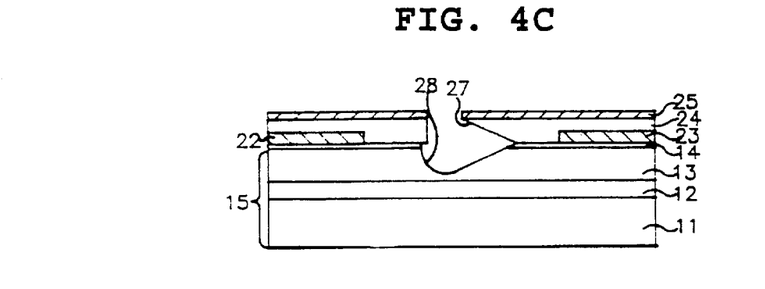

It is shown the inclined substrate which has the planarizing layer to be etched away, for adjusting the incident angle of the ion-beam upon the semiconductor substrate and selectively overcutting only the part of the planarizing layer near the drain. As shown in FIG. 4C, the anisotropic etch process such as RIE in a mixture of the methane series gas and $H_2$, for example, in the $CH_4+H_2$ mixed gas is used to etch n+ type region 14 overlying the top portion of the semiconductor layer 15 and the GaAs active layer 13, producing the recessed region 28. In the case where the process parameters such as the power, the pressure and the amount of the gas, in an anisotropic etching process like RIE, are suitably adjusted, there are frequently found the free radicals, reactive species in the opening, which corresponds to the gate length, in the feature transfer layer 25, which causes to make the ion impact energy high and then to increase the etch rate thereby. Also, it is found the distribution of the rare radicals in deep inside of the dug portion (the overcut portion of the planarizing layer) near the drain electrode 23.

The rare radicals and the scattering of the ions cause the ion impact energy to be lower. And the etch rate of the dug portion near the drain is low because during the etch process, the generated volatile compounds, for example, $(CH_3)3Ga$, $AsH_3$ and etc mostly remain stationary in there. Such a difference of the etch rates makes it possible that the recessed channel region of an asymmetrical structure has a portion which is dug in deep depth in the vicinity of the source electrode and a gradually inclined surface area in the vicinity of the drain electrode.

Figure 4D:
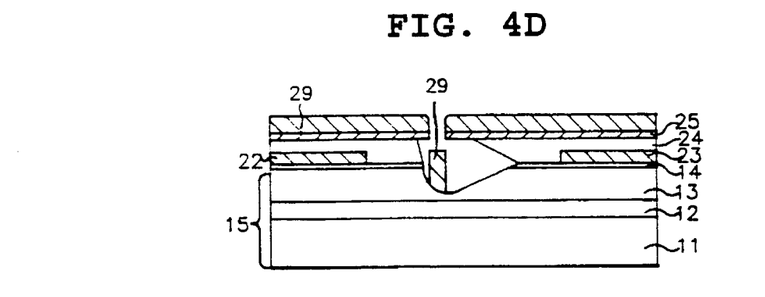

So as to carry out the metal deposition and lift-off process for gate electrode formation without fail, as shown in FIG. 4D, the etching in $O_2$ plasma is used to further etch away an inward portion of the planarizing layer 24 and then the surface damage layer and polymer(not shown), which results from the above etching process, are removed. Thereafter, the metal 29 for the gate electrode, such as Ti/Pt/Au, is deposited using the electron-beam evaporator.

Figure 4E:
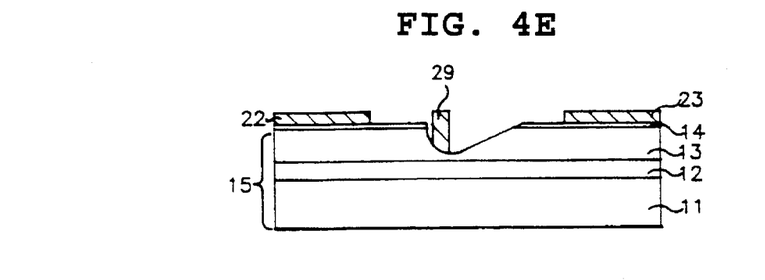

As shown in FIG. 4E, the process is completed by removing the planarizing layer 24, the feature transfer layer 25 and the gate metal layer formed on the feature transfer layer 25 using lift-off process, leaving the gate electrode 29.

Thereafter, upon removal of the feature layer 25, the resultant structure is dipped into the acetone solution to remove the planarizing layer.

It is thus made the TFT having the recessed gate structure in accordance with the invention.

Figure 6:
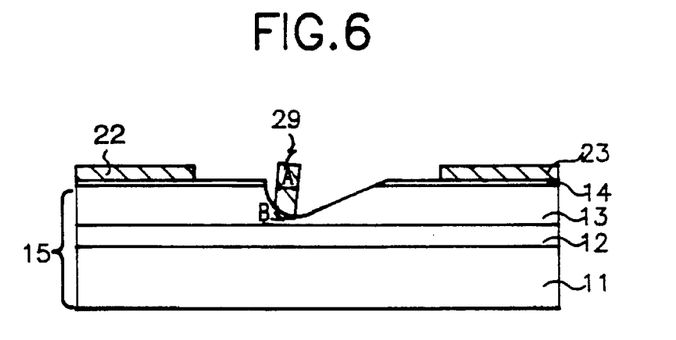
FIG. 6 is a sectional view of FET having a recessed gate structure in accordance with the second embodiment of the invention.

FIG. 6 shows a sectional view of the TFT having the recessed gate structure in accordance with the second embodiment of the invention.

In accordance with the second embodiment of the invention, as shown in FIG. 6, the FET having a recessed gate structure includes a source electrode 22 and a drain electrode 23 which are spaced apart from each other, a recessed channel region having a portion which is dug in deep depth in the vicinity of the source electrode and a gradually inclined surface area in the vicinity of the drain electrode, and located in the semiconductor layer 15 and between the source electrode 22 and the drain electrode 23 in an asymmetrical structure, and a gate electrode 29 formed over the recessed channel region and taking the inclined shape toward the source electrode.

Such an asymmetrical recessed gate structure with respect to the source/drain electrodes provides the effects of the reduction in the resistance of the gate/source electrodes 29, 22 and also removal of the electric field accumulation between the gate and the drain.

Also, the inclined gate electrode 29 toward the drain electrode results in the reduction in the effective gate length A in comparison with the physical gate length B, as well as the reduction in the leakage resistance of the source electrode due to the inclined gate structure towards the source electrode 22. Thus, there is provided the effects of the improvements of the frequency characteristics, the gain, the noise coefficient and etc.

Figure 7:
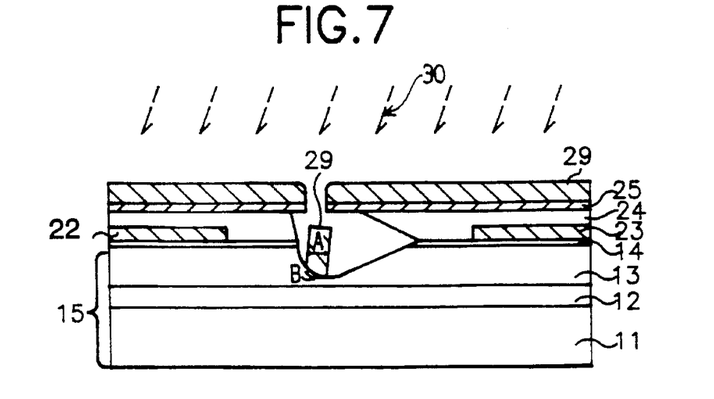
FIG. 7 is a sectional view explaining the process steps of FET having a recessed gate structure in accordance with the second embodiment of the invention.

Referring to FIG. 7, it is described the method of fabricating the FET having a recessed gate structure according to the second embodiment.

At first, the processes of FIGS. 4A to 4C are carried out in the same way as the afore-described first embodiment. Continuously, the metal layer for the gate electrode formation is deposited using the angle evaporation 30 with an inclination towards the source electrode 22, leading to the inclined structure of the gate electrode 29 towards the drain electrode 22.

Such an inclined gate structure results in the reduction in the effective gate length A in comparison with the physical gate length B, as well as the reduction in the leakage resistance of the source electrode due to the inclined gate structure towards the source electrode 22. Thus, such factors make the improvement of the frequency characteristics, the gain and the noise coefficient of the device. Thereafter, as shown in FIG. 4(e), upon removal of the planarizing layer 24, the feature transfer layer 25, and the gate metal layer formed on the feature transfer layer 25, leaving the gate electrode using lift-off process, the process for fabricating an electric field effect transistor having a gate recess structure in accordance with the second embodiment of this invention has been completed.

Figure 8:
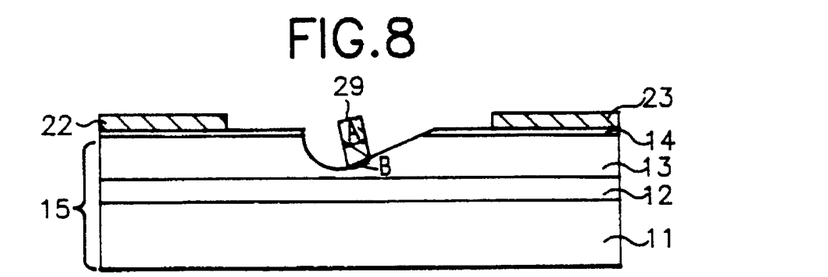
FIG. 8 is a sectional view of FET having a recessed gate structure in accordance with the third embodiment of the invention.

It is described the third embodiment of the invention, referring to FIG. 8 showing the sectional view of the FET having the recessed gate. In accordance with the third embodiment of the invention, as shown in FIG. 8, the FET having a recessed gate structure includes a source electrode 22 and a drain electrode 23 which are spaced apart from each other, a recessed channel region having a portion which is dug in deep depth in the vicinity of the source electrode and a gradually inclined surface area in the vicinity of the drain electrode, and located in the semiconductor layer 15 and between the source electrode 22 and the drain electrode 23 in an asymmetrical structure, and a gate electrode 29 formed over the recessed channel region and taking the inclined shape toward the source electrode.

Figure 9:
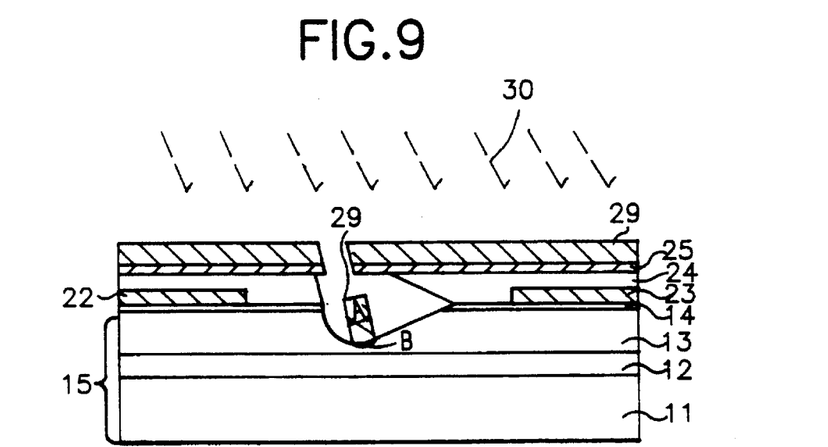
FIG. 9 is a sectional view explaining the process steps of FET having a recessed gate structure in accordance with the third embodiment of the invention.

Referring to FIG. 9, it is described the method of fabricating the FET having a recessed gate structure according to the third embodiment.

The processes of FIGS. 4A to 4C are carried out in the same way as the afore-described first embodiment.

Continuously, the metal layer for the gate electrode formation is deposited using the angle evaporation 30 with an inclination towards the source electrode 22, leading to the inclined structure of the gate electrode 29 towards the drain electrode 22.

In the same way as shown in FIG. 4E for the first embodiment, upon removal of the planarizing layer 24, the feature transfer layer 25, and the gate metal layer formed on the feature transfer layer 25, leaving the gate electrode 29 only, using lift-off process the process for fabricating an electric field effect transistor having a gate recess structure in accordance with the third embodiment of this invention has been completed.

The purpose of the fabrication process in accordance with the second and the third embodiments in this invention is to optimize values of cgs/cgd, gm/go to obtain favorable direct current and high frequency characteristics, where the cgs is a capacitance between a source and a drain, gm is gain and go is an output conductance.

Figure 10:
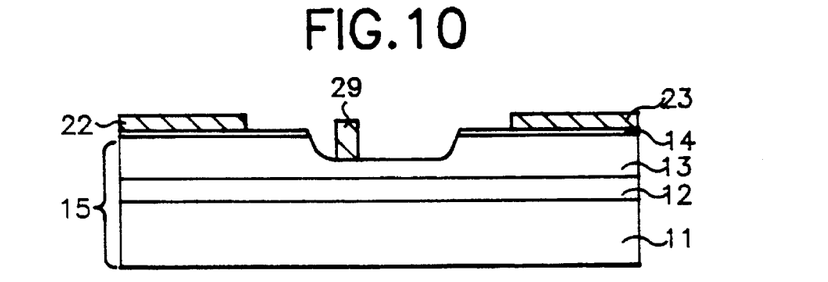
FIG. 10 is a sectional view of FET having a recessed gate structure in accordance with the fourth embodiment of the invention.

Referring to FIG. 10, it is described the method of fabricating the FET having a recessed gate structure according to the fourth embodiment. In accordance with the fourth embodiment of the invention, as shown in FIG. 10, the FET having a recessed gate structure includes a source electrode 22 and a drain electrode 23 which are spaced apart from each other over the semiconductor layer 15, a recessed channel region located in the semiconductor layer 15 and between the source electrode 22 and the drain electrode 23, and a gate electrode 29 formed over the recessed channel region and taking the inclined shape toward the source electrode.

Such a device provides the effects of the decrease in the resistance component between the gate electrode 29 and the source electrode 22 as well as the electric field concentration between the gate electrode 29 and the drain electrode 23.

This is due to the recessed gate structure that is asymmetrically positioned with respect to the source and drain electrodes, in other words, that the distance between the gate electrode 29 and the drain electrode 22 is longer than the distance between the gate electrode 29 and the source electrode 22.

Figure 11:
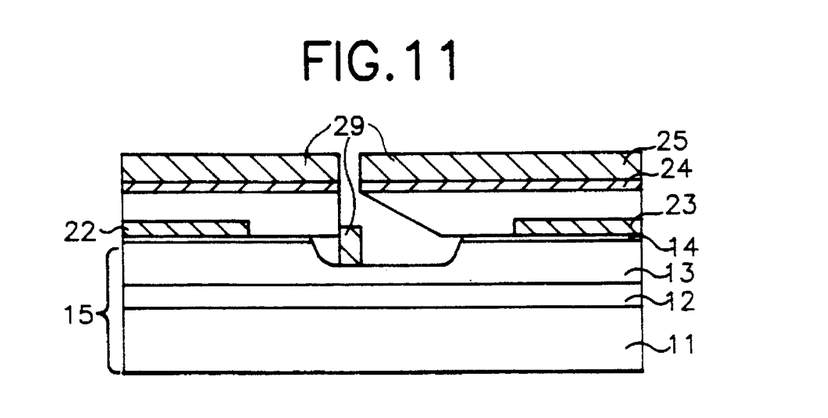
FIG. 11 is a sectional view explaining the process steps of FET having a recessed gate structure in accordance with the fourth embodiment of the invention.

Referring to FIG. 11, it is described the method of fabricating the FET having a recessed gate structure according to the fourth embodiment.

The processes of FIGS. 4A to 4B are carried out in the same way as the afore-described first embodiment. Continuously, in the vicinity of the drain electrode 23 the planarizing layer 24 is partly undercut and, as explained in the first embodiment, both the n type region 14 and the GaAs active layer 13 are isotropically etched (wet etch) to form the recessed region, instead of the producing of an asymmetrical structure by anisotropical etch process. Therefore, it is not obtained the recessed region having a portion which is dug in deep depth in the vicinity of the source electrode and a gradually inclined surface area in the vicinity of the drain electrode as shown in the first embodiment, but obtained the recessed region which is asymmetrical in view of the gate electrode. Continuously, the subsequent processing is carried out in the same way as shown in FIGS. 4D to 4E of the afore-described first embodiment, to complete the FET having the recessed gate structure in accordance with the fourth embodiment.

According to the invention, it is seen that there is provided the simplified manufacture in that the invention comprises the single etch process for the recessed gate formation, whereas in the conventional are, it is required to carry out in twice the etch process for the first and second recess so as to form the double recessed channel.

Since the recessed gate makes the asymmetrical structure with an inclination, which results from an angle etch of only the area between the gate electrode and the drain electrode without almost etching the area between the gate electrode and the source electrode so as to form the recessed structure, it can be readily removed the cause of the increase in the leakage resistance of the source electrode which is generated in the double recessed channel structure of the conventional art, the reduction of the gate breakdown voltage, the reduced gain due to the increase in feedback capacitance between the gate and the drain, the lower frequency characteristics, and the reduced output power. Therefore this invention facilitates the manufacture of the improved FET of the high output and superior low noise feature.

I claim:

1. A method of fabricating a field effect transistor having a recessed gate comprising the steps of:

preparing a substrate including, a source electrode and a drain electrode formed thereon;

forming a planarizing layer on the substrate;

forming a feature transfer layer on the planarizing layer;

forming an imaging layer on the feature transfer layer;

patterning the imaging layer into a gate electrode pattern;

etching the feature transfer layer using the imaging layer as a first mask;

removing the imaging layer;

subjecting the planarizing layer to anisotropic etching using the feature transfer layer as a second mask to undercut at the drain electrode side thereof without undercutting at the source electrode side thereof to form an undercut planarizing layer;

forming an asymmetric recessed channel region by etching the substrate using the undercut planarizing layer as a third mask;

depositing a metal layer so as to form a gate electrode on the asymmetric recessed channel region and the feature transfer layer; and removing the planarizing layer, the feature transfer layer, and the metal layer on the feature transfer layer.

2. The method of claim 1, wherein said recessed channel region is formed by etching using a mixture of methane series gas and $H_2$.

3. The method of claim 1, further comprising the step of etching the planarizing layer inwardly after the step of forming the asymmetric recessed channel region.

4. The method of claim 3, wherein said step is performed in a plasma atmosphere.

5. The method of claim 1, wherein said undercut planarizing layer is etched while the substrate is inclined so as to elevate the source electrode side of the substrate.

6. The method of claim 5, wherein said undercut planarizing layer is undercut by either ion-beam milling or RIE.

7. The method of claim 1, wherein the planarizing layer comprises photoresist material.

8. The method of claim 1, wherein the feature transfer layer comprises SiN or $SiO_2$.

9. The method of claim 1, wherein the imaging layer comprises PMMA or photoresist material.

10. The method of claim 1, wherein the deposition of the metal layer for said gate electrode is carried out by an angle deposition towards the source electrode.

11. The method of claim 1, wherein the deposition of the metal layer for said gate electrode is carried out by an angle deposition towards the drain electrode.

* * * * *